US011127656B2

(12) United States Patent
Kraft et al.

(10) Patent No.: US 11,127,656 B2
(45) Date of Patent: Sep. 21, 2021

(54) CRACK-RESISTANT SEMICONDUCTOR DEVICES

(71) Applicant: ams AG, Premstaetten (AT)

(72) Inventors: Jochen Kraft, Premstaetten (AT); Georg Parteder, Premstaetten (AT); Anderson Singulani, Premstaetten (AT); Raffaele Coppeta, Premstaetten (AT); Franz Schrank, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/483,884

(22) PCT Filed: Feb. 14, 2018

(86) PCT No.: PCT/EP2018/053694
§ 371 (c)(1),
(2) Date: Aug. 6, 2019

(87) PCT Pub. No.: WO2018/149883
PCT Pub. Date: Aug. 23, 2018

(65) Prior Publication Data
US 2020/0020611 A1 Jan. 16, 2020

(30) Foreign Application Priority Data
Feb. 15, 2017 (EP) .................................. 17156319

(51) Int. Cl.
*H01L 23/48* (2006.01)
*H01L 23/52* (2006.01)
(Continued)

(52) U.S. Cl.
CPC .......... *H01L 23/481* (2013.01); *H01L 23/528* (2013.01); *H01L 24/05* (2013.01);
(Continued)

(58) Field of Classification Search
CPC .......... H01L 23/481; H01L 2224/0557; H01L 23/528; H01L 21/76826; H01L 24/11; H01L 24/13; H01L 24/14; H01L 21/76898
(Continued)

(56) References Cited

U.S. PATENT DOCUMENTS

| 2008/0079152 A1 | 4/2008 | Tanaka et al. |
| 2009/0020842 A1 | 1/2009 | Shiau et al. |

(Continued)

FOREIGN PATENT DOCUMENTS

| CN | 105575828 | 5/2016 |
| JP | 2013-118264 | 6/2013 |
| JP | 2017-168732 | 9/2017 |

OTHER PUBLICATIONS

European Patent Office, International Search Report for PCT/EP2018/053694 dated May 24, 2018.
(Continued)

*Primary Examiner* — Didarul A Mazumder
(74) *Attorney, Agent, or Firm* — MH2 Technology Law Group LLP

(57) ABSTRACT

A semiconductor device comprises a semiconductor body and an electrically conductive via which extends through at least a part of the semiconductor body, where the via has a lateral size which is given in a first lateral direction that is perpendicular to a vertical direction given by the main axis of extension of the via and where the via has a top side and a bottom side that faces away from the top side. The semiconductor device further comprises an electrically conductive etch-stop layer arranged at the bottom side of the via in a plane which is parallel to the first lateral direction, and at least one electrically conductive contact layer at the bottom side of the via in a plane which is parallel to the first lateral direction. The lateral extent in the first lateral direc- (Continued)

tion of the etch-stop layer is larger than the lateral size of the via and the lateral extent in the first lateral direction of the contact layer is smaller than the lateral size of the via. Furthermore, the etch-stop layer is arranged between the electrically conductive via and the contact layer in the vertical direction.

19 Claims, 2 Drawing Sheets

(51) Int. Cl.
  *H01L 23/528* (2006.01)
  *H01L 23/00* (2006.01)
(52) U.S. Cl.
  CPC ...... *H01L 24/06* (2013.01); *H01L 2224/0557* (2013.01); *H01L 2224/06181* (2013.01)
(58) Field of Classification Search
  USPC .......................................................... 257/621
  See application file for complete search history.

(56) References Cited

U.S. PATENT DOCUMENTS

| | | | |
|---|---|---|---|
| 2009/0108464 A1* | 4/2009 | Uchiyama | H01L 23/481 257/774 |
| 2012/0061827 A1* | 3/2012 | Fujita | H01L 27/0617 257/737 |
| 2012/0199984 A1* | 8/2012 | Fujita | H01L 23/481 257/774 |
| 2012/0241917 A1* | 9/2012 | Ide | H01L 23/585 257/622 |
| 2012/0256300 A1* | 10/2012 | Nakamura | H01L 24/81 257/621 |
| 2013/0026599 A1* | 1/2013 | Nakamura | H01L 23/481 257/508 |
| 2013/0270670 A1* | 10/2013 | Yang | H01L 24/11 257/499 |
| 2014/0124900 A1 | 5/2014 | West et al. | |
| 2014/0264881 A1 | 9/2014 | Carrillo-Ramirez | |
| 2015/0102497 A1 | 4/2015 | Park et al. | |
| 2015/0311116 A1* | 10/2015 | Matsuura | H01L 21/76832 438/637 |
| 2016/0351441 A1* | 12/2016 | Tsukiyama | H01L 23/481 |
| 2016/0351492 A1 | 12/2016 | Watanabe et al. | |

OTHER PUBLICATIONS

Intellectual Property Office of Taiwan Office Action issued in Taiwan Application No. 107105265, dated Apr. 24, 2020, 10 pages (with English translation).

* cited by examiner

CRACK-RESISTANT SEMICONDUCTOR DEVICES

CROSS-REFERENCE TO RELATED APPLICATIONS

The present application is the national stage entry of International Patent Application No. PCT/EP2018/053694, filed on Feb. 14, 2018, which claims the benefit of priority of European Patent Application No. 17156319.0, filed on Feb. 15, 2017, all of which are hereby incorporated by reference in their entirety for all purposes.

The present application relates to a semiconductor device.

BACKGROUND OF THE INVENTION

In order to electrically contact an integrated circuit of a semiconductor device or another part of a semiconductor device, a common method is to form a through silicon via through the silicon substrate of the device. Therefore, a trench is formed in the substrate. The trench is at least partially filled with an electrically conductive contact material and the contact material is electrically isolated against the substrate. An integrated circuit which is arranged at a circuit side of the substrate can be electrically contacted via the through silicon via. The through silicon via can be electrically contacted at a contact side of the substrate facing away from a circuit side of the substrate by a solder bump. In this way, the device or the integrated circuit can be electrically contacted from the contact side of the substrate.

The contact material of the through silicon via is electrically connected with several metal layers which have an overlap with the through silicon via in vertical direction. Usually, several metal layers are arranged below the trench of the through silicon via. The different metal layers are electrically connected with each other by vertical connections. One of the metal layers is in direct contact with the contact material of the through silicon via. Around and between the metal layers an electrically non-conductive material is arranged. Therefore, in most cases, the coefficients of thermal expansion of the metal layers and the surrounding non-conductive material are different. Because of this difference in the coefficients of thermal expansion, it is possible that during processing of the semiconductor device cracks occur in or around the contact material of the through silicon via or in one of the metal layers. These cracks can lead to leakage currents or it is possible that dirt or humidity can enter the semiconductor device. Consequently, the efficiency of the semiconductor device can be decreased.

SUMMARY OF THE INVENTION

The present disclosure provides a semiconductor device with an increased efficiency.

In one embodiment of the semiconductor device, the semiconductor device comprises a semiconductor body. The semiconductor body can be a substrate or a wafer. This means the semiconductor body is a three-dimensional body and it can be a cuboid. The semiconductor body comprises a semiconductor material which can be, for example, silicon.

The semiconductor device further comprises an electrically conductive via which extends through at least a part of the semiconductor body and the via has a lateral size which is given in a first lateral direction that is perpendicular to a vertical direction given by the main axis of extension of the via. The via has a top side and a bottom side that faces away from the top side.

The via can be formed as a trench in the semiconductor body and it can be coated or filled with an electrically conductive contact material. It is possible that the trench is etched into the semiconductor device. The contact material can be, for example, tungsten. The contact material can be electrically isolated against the material of the semiconductor body by an electrically non-conductive material as, for example, silicon dioxide. The via can have the shape of a cylinder. In this case the lateral size of the via is given by the diameter of the cylinder. The diameter of the via can, for example, amount to 40 µm.

The vertical direction is perpendicular to a main plane of extension of the semiconductor body. Preferably, the lateral size of the via does not change in vertical direction. The first lateral direction is parallel to the main plane of extension of the semiconductor body.

The top side of the via is in the plane of a contact side of the semiconductor body. At the contact side of the semiconductor body the trench that forms the via is formed. At the bottom side of the via a bottom surface of the trench is positioned. This means, the trench is etched until the bottom surface. On a circuit side of the semiconductor body facing away from the contact side of the semiconductor body, an integrated circuit can be arranged.

The semiconductor device further comprises an electrically conductive etch-stop layer which is arranged at the bottom side of the via in a plane which is parallel to the first lateral direction. At the bottom side of the via, an electrically non-conductive material is arranged. In order to prevent that the non-conductive material is etched away during the etching of the via, the etch-stop layer is arranged between the via and the non-conductive material in the vertical direction. The etch-stop layer can comprise a metal as, for example, aluminum.

The semiconductor device further comprises at least one electrically conductive contact layer at the bottom side of the via in a plane which is parallel to the first lateral direction. The etch-stop layer is arranged between the via and the contact layer in vertical direction. In vertical direction between the etch-stop layer and the contact layer, the non-conductive material is arranged. The contact layer can also comprise aluminum.

The lateral extent in the first lateral direction of the etch-stop layer is larger than the lateral size of the via and the lateral extent in the first lateral direction of the contact layer is smaller than the lateral size of the via. The lateral extent in the first lateral direction of the etch-stop layer and the contact layer is measured in the first lateral direction. If the shape of the etch-stop layer and/or the contact layer is a circle, the lateral extent in the first lateral direction is given by the diameter of the circle. If the shape of the etch-stop layer and/or the contact layer is a rectangle, the extent in the first lateral direction is given by the extent of the rectangle in the first lateral direction.

The contact layer can be electrically connected with other parts of the semiconductor device. For example, the contact layer can be electrically connected with an electrical contact of an integrated circuit of the semiconductor device. By arranging several contact layers at different vertical positions, it is possible to electrically contact different parts of the semiconductor device without consuming more area of the device by forming other electrical contacts or vias.

Advantageously, the formation of cracks within the via or at the bottom side of the via is avoided since the lateral extent in the first lateral direction of the contact layer is smaller than the lateral size of the via. The etch-stop layer and the at least one contact layer are in mechanical contact with the non-conductive material. If the semiconductor device is heated and cooled down again during processing, the metals of the etch-stop layer, the contact layer and the contact material of the via show different thermal expansion than the non-conductive material. Therefore, cracks can occur around the via. However, if the lateral extent in the first lateral direction of the contact layer is smaller than the lateral size of the via, the total area where a metal is in mechanical contact with the non-conductive material is decreased. If the lateral extent in the first lateral direction of the contact layer is below a critical size, no cracks are formed because of the difference in the coefficients of thermal expansion. Therefore, the semiconductor device can be operated more efficiently.

Simulations yielded preferred values for the lateral extent in the first lateral direction of the contact layer. For the simulations, a crack is induced in a sidewall of the via close to the bottom side of the via. The energy release by introducing the crack is calculated and gives the probability that a crack will occur. For a diameter of the via of 40 μm, the lateral extent in the first lateral direction of the contact layer can be 10 to 39 μm. Preferably, the lateral extent in the first lateral direction of the contact layer amounts to 30 μm.

In one embodiment of the semiconductor device, at least one of the at least one contact layer has a thickness in vertical direction that is larger than the thickness of the etch-stop layer. The thickness of this at least one contact layer can be, for example, 3 μm. By introducing a contact layer with an increased thickness, a contact layer with a lower electrical resistance is formed which can be employed in high-frequency applications.

In one embodiment the semiconductor device comprises an electrically conductive top contact at a top contact side of the semiconductor device facing away from the top side of the via, where the top contact has a thickness in vertical direction that is larger than the thickness of the etch-stop layer and of the contact layer, respectively. This means, the top contact can comprise an electrically conductive layer which extends over a part of the lateral extent of the semiconductor device. The thickness of the top contact in vertical direction is larger than the thickness of the etch-stop layer and the thickness of the top contact in vertical direction is larger than the thickness of the contact layer. Advantageously, the etch-stop layer and the contact layer are thinner than the top contact in order to avoid the formation of cracks around the via.

In one embodiment of the semiconductor device, the etch-stop layer and at least one of the at least one contact layer have the same thickness in vertical direction. The probability for the formation of cracks can be decreased if all contact layers exhibit a thickness that is not substantially larger than the thickness of the etch-stop layer in vertical direction.

In one embodiment of the semiconductor device, the semiconductor device comprises at least two contact layers. In an optional embodiment, the semiconductor device comprises several contact layers. The contact layers can be arranged as a stack of contact layers where the etch-stop layer is arranged between the via and the stack of contact layers in vertical direction. This means, the contact layers are arranged above each other in vertical direction and optionally they exhibit the same size. Between the contact layers the non-conductive material is arranged. If the semiconductor device comprises several contact layers parts of the semiconductor device that are further away from the etch-stop layer in vertical direction can be electrically contacted.

In one embodiment of the semiconductor device, the etch-stop layer and the at least one contact layer are electrically connected by at least one electrically conductive connection. Preferably, the etch-stop layer and the contact layer are connected by several connections. If the semiconductor device comprises several contact layers, the contact layers can also be electrically connected by the connections. The connections can be arranged between the etch-stop layer and the contact layer in vertical direction and they can be parallel to the vertical direction. The connections can comprise a metal.

In one embodiment of the semiconductor device, at least one of the etch-stop layer and the at least one contact layer is electrically connected with an integrated circuit of the semiconductor device. The integrated circuit of the semiconductor device can comprise an electrical contact which can be electrically connected with the etch-stop layer or one of the at least one contact layer. Therefore, the electrical contact can be arranged in the first lateral direction next to the etch-stop layer or one of the at least one contact layer. The integrated circuit of the semiconductor device can be arranged on the semiconductor body on the circuit side.

In one embodiment of the semiconductor device, at least one of the at least one contact layer is a structured layer which is structured with an electrically non-conductive material. This means that at least one of the at least one contact layer can be formed as a grid. The contact layer can be structured in such a way that in some areas it comprises a metal and in other areas, it comprises the non-conductive material. In this way, a grid is formed. Consequently, the probability of crack formation decreases since the total amount of metal is reduced. Preferably, a contact layer which has a larger thickness in vertical direction than the etch-stop layer is a structured layer.

In one embodiment of the semiconductor device, at least one electrically conductive intermediate layer is arranged at the bottom side of the via in a plane which is parallel to the first lateral direction and the lateral extent in the first lateral direction of the intermediate layer is equal to or larger than the lateral size of the via. This means the intermediate layer can be arranged between the etch-stop layer and the contact layer in vertical direction or it is possible that the contact layer is arranged between the etch-stop layer and the intermediate layer in vertical direction. The lateral extent of the intermediate layer in the first lateral direction can, for example, be equal to the lateral extent in the first lateral direction of the etch-stop layer. The intermediate layer can also comprise a metal as, for example, aluminum. Hence, it is possible to arrange at least one electrically conductive layer, namely the intermediate layer, at the bottom side of the via which exhibits the same lateral extent in the first lateral direction as the etch-stop layer.

In one embodiment of the semiconductor device, the intermediate layer is arranged between the etch-stop layer and the contact layer in vertical direction. It is also possible that the intermediate layer is arranged between two different contact layers in vertical direction.

In one embodiment of the semiconductor device, the via is formed by a trench which is at least partially coated with an electrically conductive contact material at inner walls of the trench. The trench can be etched into the semiconductor body from the contact side of the semiconductor body towards the etch-stop layer. The inner walls of the trench can be coated with an isolation layer and with the contact material such that the contact material is electrically isolated from the semiconductor body. The contact material can be, for example, tungsten and the isolation layer can, for example, comprise silicon dioxide. Preferably, the trench is not completely filled with the contact material and the isolation layer. This means, optionally only the inner walls of the trench are coated and an inner volume of the trench is free of the contact material and the isolation layer.

In one embodiment of the semiconductor device, the etch-stop layer is in electrical and mechanical contact with the contact material of the via. For example, a bottom surface of the via can be coated with the contact material such that it is in direct contact with the etch-stop layer.

In one embodiment of the semiconductor device, the lateral extent in a second lateral direction of at least one of the at least one contact layer is larger than the lateral extent in the second lateral direction of the via. The second lateral direction is parallel to the main plane of extension of the semiconductor body. The second lateral direction can, for example, be perpendicular to the first lateral direction. In this way, one of the at least one contact layer can extend in the second lateral direction towards an electrical contact of an integrated circuit of the semiconductor device. Therefore, it is possible to electrically contact an integrated circuit of the semiconductor device with one of the at least one contact layer. In an optional embodiment, the overlap in vertical direction of the via and one of the at least one contact layer is minimal. In this way, the area where the metal is in contact with the non-conductive material is minimized such that the probability that cracks will occur is also minimized.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION

Figure 1:
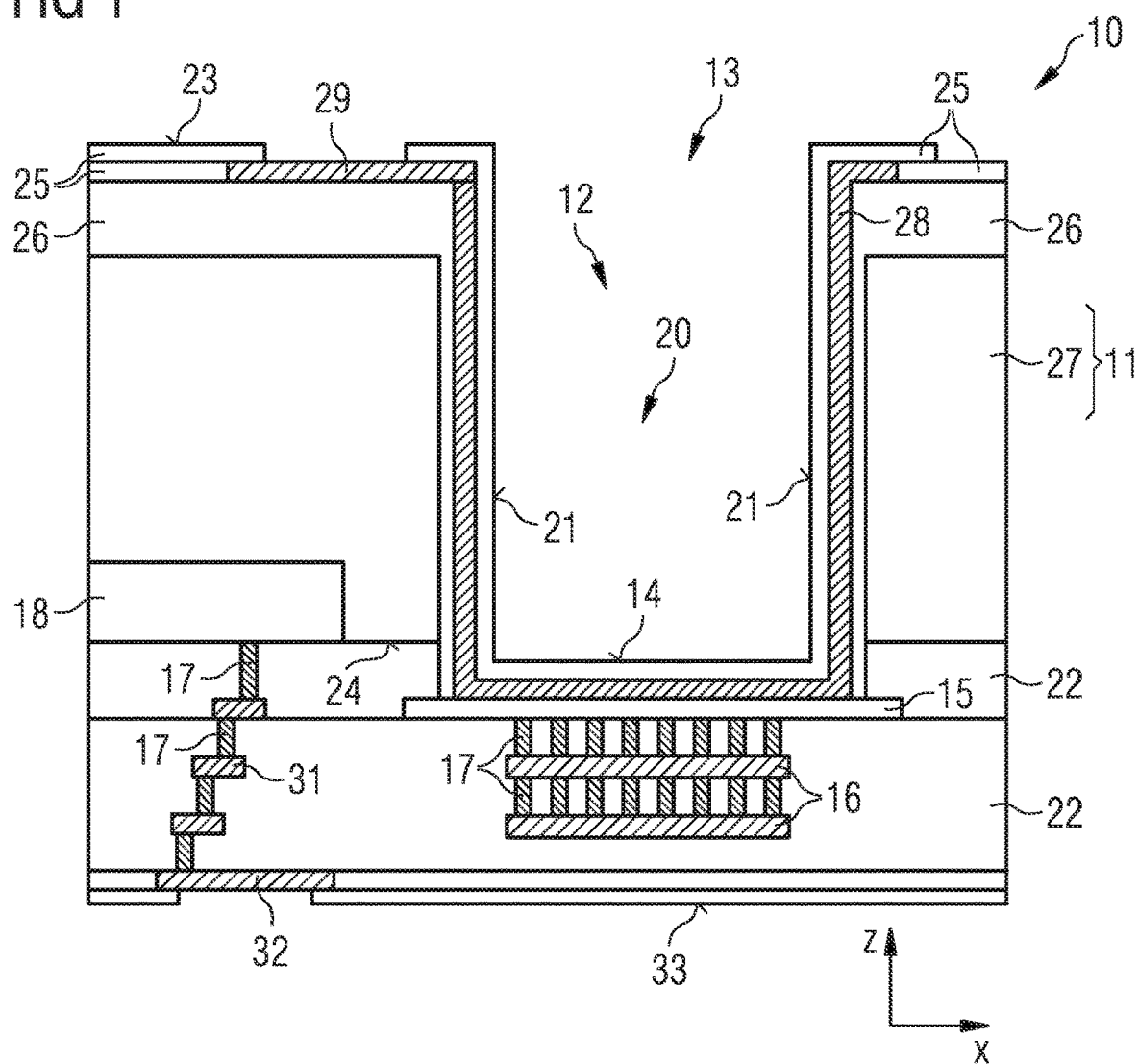
FIG. 1 shows a cutaway view of an exemplary embodiment of the semiconductor device.

In FIG. 1, a cutaway view of an exemplary embodiment of a semiconductor device 10 is shown. The semiconductor device 10 comprises a semiconductor body 11. The semiconductor body 11 comprises a substrate 27. The substrate 27 can, for example, comprise silicon. Furthermore, an electrically non-conductive material 22 is arranged on the substrate 27 at a circuit side 24 of the semiconductor body 11. Within the non-conductive material 22, other materials such as metals are arranged. Moreover, at the circuit side 24 of the semiconductor body 11 an integrated circuit 18 is arranged.

An electrically conductive via 12 extends through the semiconductor body 11 and a part of the non-conductive material 22. The via 12 has a main axis of extension which is perpendicular to the main plane of extension of the substrate 27. This means the main axis of extension of the via 12 is parallel to a vertical direction z which is perpendicular to the main plane of extension of the substrate 27. The via 12 has a lateral size which is given in a first lateral direction x that is perpendicular to the vertical direction z. This means the first lateral direction x is parallel to the main plane of extension of the substrate 27. The via 12 has a top side 13 which faces away from the non-conductive material 22. A bottom side 14 of the via 12 is arranged at the side of the via 12 which faces away from the top side 13 of the via 12.

The via 12 can be formed in the semiconductor body 11 by etching a trench 20 in the semiconductor body 11 from a contact side 23 which faces away from the non-conductive material 22. The trench 20 comprises inner walls 21 which are coated with an isolation layer 26. The isolation layer 26 is deposited at the top side 13 of the via 12 such that also the substrate 27 is at least partially covered with the isolation layer 26. After the deposition of the isolation layer 26, the inner walls 21 of the trench 20 are coated with an electrically conductive contact material 28 which can be tungsten. After the deposition of the contact material 28, a passivation layer 25 is deposited at the inner walls 21 of the trench 20. Furthermore, a back contact 29 is deposited at the contact side 23 of the semiconductor body 11 where the back contact 29 can be electrically contacted. The back contact 29 can comprise aluminum. The contact side 23 of the semiconductor body 11 is partially coated with another passivation layer 25.

In this embodiment, the trench 20 of the via 12 is not completely filled with the isolation layer 26, the passivation layer 25 and the contact material 28. This means the via 12 comprises an inner volume which is free of the isolation layer 26, the contact material 28 and the passivation layer 25.

At the bottom side 14 of the via 12, an electrically conductive etch-stop layer 15 is arranged in a plane which is parallel to the first lateral direction x. When the trench 20 is etched in the semiconductor body 11, the material of the semiconductor body 11 and the non-conductive material 22 is etched until the etch-stop layer 15. This means the etch-stop layer 15 acts as an etch stop for the etching of the trench 20.

The etch-stop layer 15 can be formed by aluminum and the lateral extent in the first lateral direction x of the etch-stop layer 15 is larger than the lateral size of the via 12. In this case, the etch-stop layer 15 is arranged symmetrically below the via 12 with respect to the vertical direction z.

Two electrically conductive contact layers 16 are arranged at the bottom side 14 of the via 12 in a plane which is parallel to the first lateral direction x and the etch-stop layer 15 is arranged between the via 12 and the contact layers 16 in vertical direction z. This means the two contact layers 16 are arranged below the etch-stop layer 15 in vertical direction z and they are also symmetrically arranged with respect to the vertical direction z. The lateral extent in the first lateral direction x of the contact layers 16 is smaller than the lateral size of the via 12.

The first contact layer 16 which is arranged between the second contact layer 16 and the etch-stop layer 15 is electrically connected with the etch-stop layer 15 by electrically conductive connections 17 which extend in vertical direction z between the etch-stop layer 15 and the first contact layer 16. The second contact layer 16 is electrically connected with the first contact layer 16 by the connections 17 which extend in vertical direction z between the two contact layers 16. The etch-stop layer 15 is in mechanical and electrical contact with the contact material 28 at the bottom side 14 of the via 12. The etch-stop layer 15, the contact layer 16 and the connections 17 are surrounded by the non-conductive material 22.

If the semiconductor device 10 is heated and cooled down again during processing, the metals of the etch-stop layer 15, the contact layer 16 and the contact material 28 of the via 12 show different thermal expansion than the non-conductive material 22. Therefore, cracks can occur around the via 12. However, since the lateral extent in the first lateral direction x of the contact layer 16 is smaller than the lateral size of the via 12, the total area where a metal is in mechanical contact with the non-conductive material 22 is decreased. If the lateral extent in the first lateral direction x of the contact layer 16 is below a critical size, no cracks are formed because of the difference in the coefficients of thermal expansion. Therefore, the semiconductor device 10 can be operated more efficiently.

In the first lateral direction x next to the contact layer 16 and the etch-stop layer 15, several metal pads 31 can be arranged. In this case, the metal pads 31 are arranged in the same lateral planes as the etch-stop layer 15 and the contact layer 16. The metal pads 31 can comprise a metal as, for example, aluminum. The metal pads 31 are electrically connected by connections 17. It is possible that the contact layers 16 are electrically connected with one of the metal pads 31. It is possible that the contact layers 16 are electrically connected with the metal pads 31 in another plane through the semiconductor device 10 which is not shown in FIG. 1. The metal pads 31 are electrically connected with an electrically conductive top contact 32 of the semiconductor device 10 and the integrated circuit 18. The top contact 32 of the semiconductor device 10 is arranged at a top contact side 33 of the semiconductor device 10 which faces away from the contact side 23 of the semiconductor body 11. The top contact 32 can have a thickness in vertical direction z that is larger than the thickness of the etch-stop layer 15 and of the contact layer 16.

Figure 2:
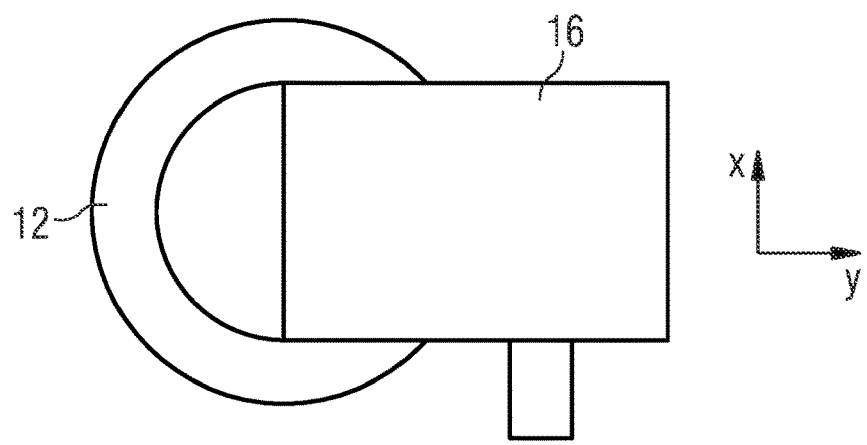
FIG. 2 shows a schematic top view on a via and a contact layer.

In FIG. 2, a top view on the via 12 and a contact layer 16 is shown. In this embodiment, the via 12 has a circular shaped cross-section. Therefore, the lateral size of the via 12 is given by the diameter of the via 12. The contact layer 16 which is arranged below the via 12 has a rectangular shape. In the first lateral direction x, the extent of the contact layer 16 is smaller than the diameter of the via 12. However, in a second lateral direction y, which is perpendicular to the first lateral direction x, the lateral extent of the contact layer 16 is larger than the diameter of the via 12. Therefore, the contact layer 16 can extend towards other parts of the semiconductor device 10 and it can, for example, be electrically connected with an integrated circuit 18 of the semiconductor device 10.

Figure 3:
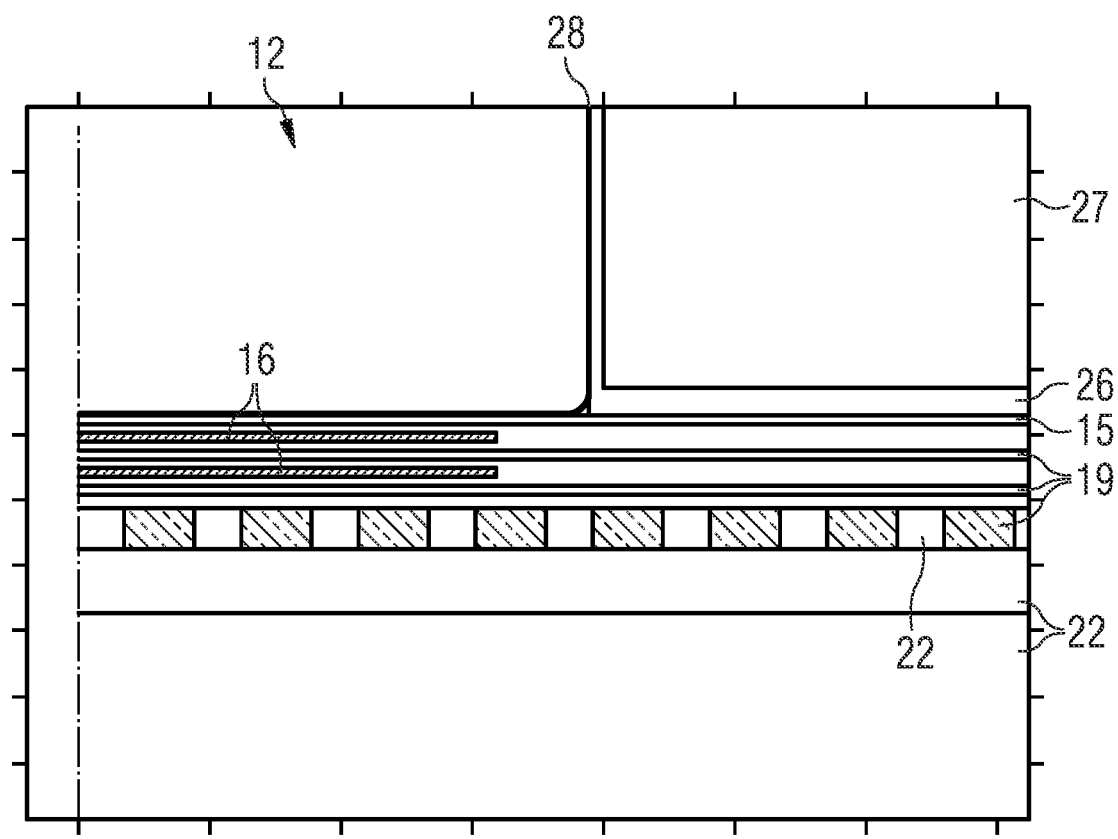
FIG. 3 shows a cutaway view of a part of an exemplary embodiment of the semiconductor device.

In FIG. 3, a schematic cutaway view of a part of an exemplary embodiment of the semiconductor device 10 is shown. The via 12 is arranged within the semiconductor body 11 and the inner walls 21 of the via 12 are coated with an isolation layer 26 and the contact material 28. The etch-stop layer 15 is arranged at the bottom side 14 of the via 12. Two contact layers 16 are also arranged at the bottom side 14 of the via 12. Furthermore, three intermediate layers 19 are arranged at the bottom side 14 of the via 12. The lateral extent in the first lateral direction x of the intermediate layers 19 is larger than the lateral size of the via 12. The intermediate layer 19 which is the furthest away from the via 12 in vertical direction z is thicker in vertical direction z than the contact layers 16 and the other intermediate layers 19. Moreover, the thicker intermediate layer 19 is structured with the non-conductive material 22. It is structured in such a way that a grid structure of the thicker intermediate layer 19 is formed. Consequently, the probability of crack formation can be decreased since the total amount of metal is reduced.

The invention claimed is:

1. A semiconductor device, comprising:
a semiconductor body,
an electrically conductive via that extends through at least a part of the semiconductor body, wherein the electrically conductive via has a lateral size in a first lateral direction within the semiconductor body, wherein the first lateral direction is perpendicular to a vertical direction given by a main axis of extension of the electrically conductive via and where the via has a top side and a bottom side that faces away from the top side,
an electrically conductive etch-stop layer arranged at the bottom side of the electrically conductive via in a plane that is parallel to the first lateral direction, and
at least one electrically conductive contact layer at the bottom side of the electrically conductive via in a plane that is parallel to the first lateral direction and wherein each of the at least one electrically conductive contact layer is centered with respect to the via,
wherein a lateral extent in the first lateral direction of the electrically conductive etch-stop layer is larger than the lateral size of the electrically conductive via at the bottom side of the electrically conductive via,
wherein a lateral extent in the first lateral direction of the at least one electrically conductive contact layer is smaller than the lateral size in the first lateral direction of the electrically conductive via at the bottom side of the electrically conductive via within the semiconductor body, and
wherein the electrically conductive etch-stop layer is arranged between the electrically conductive via and the at least one electrically conductive contact layer in the vertical direction.

2. The semiconductor device according to claim 1, wherein the lateral extent in the first lateral direction of the at least one electrically conductive contact layer is between 10 μm and 39 μm.

3. The semiconductor device according to claim 1, wherein the at least one electrically conductive contact layer has a thickness in the vertical direction that is larger than a thickness of the electrically conductive etch-stop layer.

4. The semiconductor device according to claim 1, wherein the semiconductor device comprises an electrically conductive top contact at a top contact side of the semiconductor device facing away from the top side of the electrically conductive via, wherein the electrically conductive top contact has a thickness in the vertical direction that is larger than a thickness of the electrically conductive etch-stop layer and a thickness of the at least one electrically conductive contact layer, respectively.

5. The semiconductor device according to claim 1, wherein the electrically conductive etch-stop layer and of the at least one electrically conductive contact layer have the same thickness in the vertical direction.

6. The semiconductor device according to claim 1, wherein the semiconductor device comprises at least two electrically conductive contact layers.

7. The semiconductor device according to claim 1, wherein the electrically conductive etch-stop layer and the at least one electrically conductive contact layer are electrically connected by at least one electrically conductive connection.

8. The semiconductor device according to claim 1, wherein at least one of the electrically conductive etch-stop layer or the at least one electrically conductive contact layer is electrically connected with an integrated circuit of the semiconductor device.

9. The semiconductor device according to claim 1, wherein the at least one electrically conductive contact layer is a structured layer that is structured with an electrically non-conductive material that forms a grid.

10. The semiconductor device according to claim 1, wherein at least one electrically conductive intermediate layer is arranged at the bottom side of the electrically conductive via in a plane that is parallel to the first lateral direction and wherein a lateral extent in the first lateral direction of the at least one electrically conductive intermediate layer is equal to or larger than the lateral size in the first lateral direction of the electrically conductive via within the semiconductor body.

11. The semiconductor device according to claim 10, wherein the at least one electrically conductive intermediate layer is arranged between the electrically conductive etch-stop layer and the at least one electrically conductive contact layer in the vertical direction.

12. The semiconductor device according to claim 1, wherein the electrically conductive via is formed by a trench that is at least partially coated with an electrically conductive contact material at inner walls of the trench.

13. The semiconductor device according to claim 12, wherein an inner volume of the trench is free of the electrically conductive contact material.

14. The semiconductor device according to claim 13, wherein the electrically conductive etch-stop layer is in electrical contact and mechanical contact with the electrically conductive contact material of the electrically conductive via.

15. The semiconductor device according to claim 1, wherein a lateral extent in a second lateral direction of the at least one electrically conductive contact layer is larger than a lateral extent in the second lateral direction of the electrically conductive via.

16. The semiconductor device according to claim 1, wherein the lateral extent in the first lateral direction of the at least one electrically conductive contact layer amounts to 25% to 99% of the lateral size in the first lateral direction of the electrically conductive via within the semiconductor body.

17. The semiconductor device according to claim 1, wherein the lateral extent in the first lateral direction of the at least one electrically conductive contact layer amounts to 70% to 80% of the lateral size in the first lateral direction of the electrically conductive via within the semiconductor body.

18. The semiconductor device according to claim 1, further comprising at least one wall of the electrically conductive via extending from the bottom side of the electrically conductive via wherein the at least one wall is substantially vertical.

19. The semiconductor device according to claim 1, wherein:
the lateral extent in the first lateral direction of the electrically conductive etch-stop layer is larger than the lateral size of the electrically conductive via at any depth of the electrically conductive via, and
the lateral extent in the first lateral direction of the at least one electrically conductive contact layer is smaller than the lateral size in the first lateral direction of the electrically conductive via at any depth of the electrically conductive via within the semiconductor body.

* * * * *